(12) United States Patent
Valle

(10) Patent No.: US 9,387,509 B2
(45) Date of Patent: Jul. 12, 2016

(54) METHOD FOR INFILTRATING A POROUS MATERIAL WITH A SECOND MATERIAL

(75) Inventor: Massimiliano Valle, Bergamo (IT)

(73) Assignee: Petroceramics S.p.A., Milan (IT)

( * ) Notice: Subject to any disclaimer, the term of this patent is extended or adjusted under 35 U.S.C. 154(b) by 123 days.

(21) Appl. No.: 14/005,192

(22) PCT Filed: Mar. 14, 2012

(86) PCT No.: PCT/IB2012/051207
§ 371 (c)(1),
(2), (4) Date: Nov. 19, 2013

(87) PCT Pub. No.: WO2012/123907
PCT Pub. Date: Sep. 20, 2012

(65) Prior Publication Data
US 2014/0072710 A1    Mar. 13, 2014

(30) Foreign Application Priority Data

Mar. 14, 2011    (IT) .............................. MI2011A0401

(51) Int. Cl.
*B05D 3/02*    (2006.01)
*B05D 3/04*    (2006.01)
(Continued)

(52) U.S. Cl.
CPC ............ *B05D 3/0218* (2013.01); *B05D 3/0493* (2013.01); *C04B 35/565* (2013.01); *C04B 35/573* (2013.01); *C04B 35/63476* (2013.01); *C04B 35/63496* (2013.01); *C04B 35/76* (2013.01); *C04B 35/806* (2013.01); *C04B 41/85* (2013.01); *C23C 16/4481* (2013.01);
(Continued)

(58) Field of Classification Search
None
See application file for complete search history.

(56) References Cited

U.S. PATENT DOCUMENTS

2008/0213155 A1    9/2008    Kienzle
2009/0149308 A1    6/2009    Kienzle

FOREIGN PATENT DOCUMENTS

WO    2007063562    6/2007
WO    2008007401    1/2008
(Continued)

*Primary Examiner* — William Phillip Fletcher, III
(74) *Attorney, Agent, or Firm* — Nicolo Davidson; Waller Lansden Dortch & Davis, LLP

(57) ABSTRACT

A method for treating a piece (1) made of a first porous material (8) with a second material (2) when this second material is in liquid state, said second material (2) being suitable for infiltration when a predetermined temperature range (DTi) and a predetermined field of infiltration pressure (Dpi), comprises the steps of: —providing a crucible (4) suitable for containing the piece (1) and the second material (2) and capable of withstanding the temperatures and pressures for the infiltration of the second material (2) in the piece (1); providing a cover (5) for the crucible (4) suitable for closing the crucible creating a chamber (6) inside the crucible; placing the piece (1) and the second material (2) in said crucible chamber (6), when this second material is not yet in liquid state; —subsequently closing the crucible (4) with the cover (5); —at a pressure (pa or pa1)—unsuitable for the infiltrations of the second material in the first porous material, raising the temperature of the piece (1) and the second material (2) contained in the crucible up to a predetermined temperature (T2) suitable for liquefying said second material (2) for making it suitable for infiltration in said piece (1) made of first porous material; —subsequently, lowering the pressure to a predetermined pressure value (p2) lower than the previous pressure (pa or pa1) and allow the infiltration of the second material (2) in said piece (1) made of first porous material (8).

14 Claims, 10 Drawing Sheets

(51) Int. Cl.
| | |
|---|---|
| C04B 35/565 | (2006.01) |
| C04B 35/573 | (2006.01) |
| C04B 41/85 | (2006.01) |
| C04B 35/80 | (2006.01) |
| F27B 17/00 | (2006.01) |
| F27D 5/00 | (2006.01) |
| F27D 7/06 | (2006.01) |
| F27B 9/02 | (2006.01) |
| F27B 9/04 | (2006.01) |
| F27B 9/36 | (2006.01) |
| F27B 14/04 | (2006.01) |
| F27B 14/14 | (2006.01) |
| C04B 35/634 | (2006.01) |
| C04B 35/76 | (2006.01) |
| F16D 69/02 | (2006.01) |
| C23C 16/448 | (2006.01) |
| F16D 65/12 | (2006.01) |
| F16D 69/00 | (2006.01) |
| F16D 65/02 | (2006.01) |
| F16D 69/04 | (2006.01) |

(52) U.S. Cl.
CPC ............ *F16D65/12* (2013.01); *F16D 69/023* (2013.01); *F27B 9/028* (2013.01); *F27B 9/045* (2013.01); *F27B 9/36* (2013.01); *F27B 14/04* (2013.01); *F27B 14/14* (2013.01); *F27B 17/0016* (2013.01); *F27D 5/0068* (2013.01); *F27D 7/06* (2013.01); *B05D 2203/30* (2013.01); *B05D 2259/00* (2013.01); *B05D 2401/30* (2013.01); *C04B 2235/3817* (2013.01); *C04B 2235/3826* (2013.01); *C04B 2235/3852* (2013.01); *C04B 2235/408* (2013.01); *C04B 2235/425* (2013.01); *C04B 2235/48* (2013.01); *C04B 2235/526* (2013.01); *C04B 2235/5244* (2013.01); *C04B 2235/5248* (2013.01); *C04B 2235/5252* (2013.01); *C04B 2235/5256* (2013.01); *C04B 2235/5427* (2013.01); *C04B 2235/5436* (2013.01); *F16D 2065/1316* (2013.01); *F16D 2065/1332* (2013.01); *F16D 2069/008* (2013.01); *F16D 2069/0491* (2013.01); *F16D 2200/0047* (2013.01); *F16D 2200/0069* (2013.01); *F16D 2250/0046* (2013.01)

(56) References Cited

FOREIGN PATENT DOCUMENTS

| WO | WO 2008/007401 A1 * | 1/2008 |
|---|---|---|
| WO | 2010108744 | 9/2010 |
| WO | WO 2010/108744 A1 * | 9/2010 |

* cited by examiner

METHOD FOR INFILTRATING A POROUS MATERIAL WITH A SECOND MATERIAL

The present invention refers to a method for treating a piece made of a first porous material with the infiltration of a second material, as well as to a plant for implementing such method.

As known, the process for the infiltration of a material or second material in a first porous material, occurs at predetermined pressure and temperature conditions.

For example, in the case of a carbon matrix and a second silicon-based material to be infiltrated, it is possible to draw a curve in a temperature and pressure plane delimiting two areas in which, for each temperature and pressure condition, in a first area there does not occur the infiltration of silicon in the carbon matrix, or in a second area there occurs the infiltration of silicon in the carbon matrix. As observable from FIG. 3, where in abscissae there are indicated the temperatures and in ordinates there are indicated the pressures, or the vacuum obtained in the environment where the piece to be infiltrated is placed, in case of carbon matrix and silicon to be infiltrated in this matrix, the curve which delimits the conditions in which there occurs the transition from an underlying area in which the infiltration of the silicon in the carbon matrix and carbon fibres occurs at an overlying area in which the infiltration does not occur, has, in a graphic with axes in logarithmic scale, a less than linear development with concavity facing the horizontal axis of the temperatures. In case of use of another type of matrix and second material this curve will have a different shape but it will substantially divide the plane in a similar manner, i.e. in an area of temperatures and pressures where the infiltration does not occur and an area where it occurs.

Actually, as known, infiltration is a phenomenon regulated by the capillarity force. Infiltration is determined by various factors. First and foremost, the phenomenon is conditioned by the characteristics of the pre-form provided in the first porous material, i.e. the composition, structure, porosity thereof etc.

Furthermore, even the viscosity of the second material, for example silicon, is a factor strongly conditioning and strongly depending on the chemical reaction of this second material with the porous matrix, as well as on other parameters such as for example the temperature and pressure.

Furthermore, the capillarity is strongly conditioned by the wetting angle of the second material on the first porous material, for example of silicon on the porous carbon pre-form, which besides depending on the pre-form and on the silicon, also strongly depends on the composition of the atmosphere in which these two materials are submerged. Should it for example be in strong vacuum conditions in a rarefied atmosphere of gaseous species and derived from the evaporation of the silicon and sublimation of carbon with all the possible combinations thereof, there will be a capillarity strongly different from the conditions in which there are also present species derived from the gases present in the atmosphere.

Typically, the infiltration processes occur at a predetermined pressure, initiating the penetration of the second material in the porous matrix upon the increase of the temperature, as represented in FIG. 4.

For example, document U.S. Pat. No. 7,763,224 describes a process wherein a porous carbon component is infiltrated with silicon liquid. The component is passed through a series of stations where the temperature is gradually increased reducing the pressure with the aim of entering in the area of the graphic of FIG. 4 which bears pressure and temperature conditions suitable for the infiltration of silicon in the porous matrix, according to the arrow indicated therein with reference 100. The component, in free environment passing from one station to another, increases in terms of temperature until it reaches a station in which silicon already in liquid state is injected in the furnace chamber in which there is present the component to be infiltrated, ensuring that the silicon liquid infiltrates the porous carbon matrix through capillarity.

An analogous solution is represented in document US2009/0149308, where the component passes through different chambers in which the pressure is lowered, the temperature is increased up to injecting the liquid silicon so that the infiltration occurs.

Though satisfactory from various points of view, the methods represented in these documents of the prior art reveal considerable complexity in the management of injection of liquid silicon into a furnace, leading to the need for extremely complex and expensive plants. Furthermore, the piece passing through different stations leads to the compulsory need of a plant which is very complex and expensive to construct, suitable for the creation of low pressure environments and progressively increasing temperature. Also as observable from the figures for example of document US2009/0149308, the environments of the plant all substantially operate at low pressure making the provision of partitions within a chamber instead of outside with respect thereto unnecessary.

Furthermore, as known, in these types of plants several hours are required to allow transition from the area of temperature and pressure conditions not suitable for infiltration, to the area of pressures and temperatures suitable for infiltration, as represented in FIG. 4 by the arrow 100, forcing the components and the pieces to remain in the high temperature chambers and simultaneously at a low pressure over a considerable period of time, however making the process particularly difficult and expensive.

WO 2008/007401 of the BREMBO CERAMIC BRAKE SYSTEMS shows a method for the infiltration of molten silicon in a carbon-based porous matrix. This process occurs by inserting the porous body in a container alongside silicon and then the temperature is raised up to 1400-1700° C. while vacuum is simultaneously created at 0.3-0.2 mbars. This further firing occurs in presence of vacuum and over an indicated period of time of 8 hours and thus revealing all the aforementioned drawbacks.

WO 2010/108744 of FRENI BREMBO SPA shows a method for the infiltration of silicon in a porous matrix of carbon wherein it is clearly indicated to first lower the pressure to values of 0.01-250 mbars and preferably 1 mbar and then only subsequently raise the temperature to 1400-1700° C. preferably 1500° C. (see the description in paragraphs [0059] and [0060]). Thus, also this solution reveals all the drawbacks mentioned beforehand.

Thus, an object of the present invention is to provide a method for treating a piece made of a first porous material with the infiltration of a second material capable of allowing overcoming the drawbacks of the prior art.

In particular, an object of the present invention is to provide a method capable of allowing simplifying the infiltration process of a second material into a porous matrix of a first material, thus also simplifying the plant for implementing such method.

According to a general embodiment, a method for treating a piece made of a first porous material with a second material, when this second material is in liquid state, wherein this second material is suitable for infiltration and, advantageously but not necessarily, for the reaction with said first material when it is in a predetermined temperature range and a predetermined infiltration pressure range, comprises the steps of:

providing a crucible suitable for containing the piece made of a first porous material and the second material, said crucible being capable of withstanding the temperatures and pressures for the infiltration of the second material in the first porous material;

providing a cover for the crucible suitable for closing the crucible creating a chamber inside the crucible, for example but not necessarily insulated so as to be suitable for exploiting the possible adiabaticity of the system and the possible but not necessary exothermicity created by the possible reaction of the second material infiltrated in the first, and for example but not necessarily a cover suitable for the exit of the gases so as to create vacuum in the crucible inner chamber;

placing the piece and the second material in said crucible chamber, when this second material is not yet in liquid state;

subsequently closing the crucible with the cover;

at a pressure unsuitable for the infiltration of the second material in the first porous material, raising the temperature of the piece of the second material contained in the crucible up to a predetermined temperature suitable for liquefying said second material for making it suitable for infiltration in said piece made of a first porous material;

only subsequently, for example without supplying energy for increasing the temperature, but also allowing a further supply of energy, lowering the pressure to a predetermined pressure value lower than the previous pressure and allow the infiltration of the second material in said piece made of first porous material.

According to a general embodiment of the invention, a plant for treating a piece made of a first porous material with a second material when this second material is in liquid state comprises:

a piece to be infiltrated made of a first porous material;

a second material suitable for infiltration and reaction with said first material when in a predetermined temperature range and predetermined infiltration pressure range;

a crucible having a crucible chamber containing said piece and said second material;

a crucible cover which closes the crucible delimiting said inner chamber;

at least one vacuum creating device for reducing pressure at least inside said crucible inner chamber up to an infiltration pressure suitable for the infiltration of the second material when in liquid state at the infiltration temperature;

a furnace for increasing the temperature up to an infiltration temperature suitable for the infiltration of the second material when in liquid state at the infiltration pressure;

a station wherein said piece and said second material are introduced into said crucible chamber;

a station, according to an embodiment even the heating station, wherein said crucible introduced into said furnace increases the temperature of the crucible chamber when the vacuum creating device is not operating and maintain or possibly but not necessarily increase the temperature of the crucible chamber when the vacuum creating device becomes operative and lowers the pressure to the predetermined infiltration pressure;

a control device which regulates the temperature of the furnace up to an infiltration temperature and only subsequently adjusts the pressure lowering it until it reaches the infiltration pressure.

Due to the provision of a method and a plant suitable for controlling the temperature increase at a pressure unsuitable for infiltration of the second material in the first porous material and only after reaching the temperature suitable for the infiltration reduce the pressure up to obtaining a pressure suitable for the infiltration of the second material in the porous material, it is possible to obtain a method which is particularly rapid in the infiltration of the second material in the first porous material allowing an accurate control of the infiltration method and extremely low process times.

From an industrial point of view, the management of the temperature variations especially on large-scale plants is a slow process, while the vacuum variation, particularly a vacuum suitable for infiltration, for example made of silicon in a porous carbon matrix, is a very rapid process, at times almost instantaneous.

Varying the pressure allows triggering the infiltration process within a few minutes, avoiding the use of mechanical constraints which determine the contact between previously molten silicon and pre-form, for example means for injecting the molten silicon in the chamber where the piece to be infiltrated is placed.

Contrary to the state of the art processes, in which the temperature is increased at low pressure, forcing the liquid silicon to an infiltration progressively involving the material starting from the smallest capillaries and determining an infiltration front which leaves behind—in most cases—areas where the infiltration is yet to be completed; with the method and the plant subject of the proposal it is possible to obtain an infiltration on capillaries also having different dimensions practically simultaneously avoiding leaving vacuums behind the advancement front of the infiltration.

For example, infiltrating porous carbon pre-forms with silicon there occurs a reaction between the carbon silicon forming silicon carbides. Such reaction, as known, is strongly exothermic. Given that this reaction in the proposed method occurs within very rapid periods of time unsuitable to allow a dissipation of the heat produced by the reaction outside the crucible, the material becomes a heating element in the furnace and determines a strong temperature rise in the furnace and especially in the material, making the infiltration process even more rapid, since the great temperature increase brings the process in environmental conditions extensively into the infiltration field defined by the optimal pressure and temperature conditions.

Obviously, the provision of this process and plant particularly rapid at obtaining the infiltration allow an easier application at industrial level, allowing for example operating in series, for example providing for a series of crucibles which are progressively supplied to the plant. The provision of a relatively small environment such as the chamber of the crucible to guarantee the optimal conditions, allows making this plant much simpler to obtain with respect to a plant wherein a plurality of pieces should remain in a series of furnaces all substantially placed at low or extremely low pressures over long periods of time.

Exploiting the exothermicity of the reaction between silicon and carbon to form the silicon carbide, it is possible to reach a temperature in the material placed in the crucible that the furnace would not be capable of reaching or, alternatively, saving energy due to the overheating of the furnace.

In particular, the provision of raising the temperature at pressure conditions unsuitable for infiltration allows suitably cleaning the carbon of the porous matrix of the piece. Actually, in the piece there occurs a pyrolysis and only after an infiltration of the second material.

Advantageously, the matrix may be made of carbon and preferably the matrix is made of a composite of carbon and fibres for example carbon fibres.

Furthermore, in the case of silicon as second material, the silicon present in the crucible at high temperatures forms silicon vapours which penetrate into the porosities of the piece starting a reaction with the carbon of the surfaces of the porosities forming silicon carbides and preferably a silicon carbide film which on one hand preserves the material of the porous matrix and on the other hand facilitates the infiltration of the liquid silicon when the pressure is lowered.

The proposed method and plant allow a greater control of the infiltration which, for example, allows preserving the carbon fibres. Contrary to the methods of silicon infiltration in carbon matrices and carbon fibre of the state of the art, wherein there was the obligation to provide for a high percentage of volume of carbon fibre to obtain a product infiltrated with an optimal fibre volume percentage, due to a more extensive reaction of the carbon of the fibre with the silicon forming silicon carbides of the method of the state of the art, in the proposed method and plant the infiltration speed and prior heating in absence of infiltration but in the presence of silicon, allow preserving the carbon fibres, and thus for example using a lower fibre volume percentage with respect to what is used in the solutions of the prior art to have the same mechanical characteristics of the infiltrated piece.

According to an embodiment, and as observable in FIGS. 12 and 13, a first part of the process occurs by raising the temperature, for example but not necessarily in isobaric manner, and however at a pressure unsuitable for infiltration even for the maximum temperature selected for the process. In this step the temperature and pressure conditions to which the material is subjected, though varying, always remain within the field delimited by letter "A", i.e. conditions unsuitable for infiltration.

According to an embodiment, in the first steps of the process there can also be carried out vacuum cycles, according to the path of FIG. 12 at subsequent vertical and horizontal sections, for example for cleaning and degassing the material in the initial steps. According to an embodiment, the state of the materials can be modified by varying the pressure and the temperature according to the arrow inclined upwards but still remaining in the non-infiltration area marked with letter "A", so as to not allow the infiltration reaction.

Advantageously and according to an embodiment, the pressure is reduced in a substantially isothermal way to enter in the field "B" of FIGS. 12 and 13 having pressure and temperature conditions suitable for infiltration only subsequently.

According to an embodiment, after reaching a predetermined temperature T2 without the infiltration occurring, the pressure is lowered, advantageously already having reached the predetermined temperature the pressure can be lowered even on large volumes within a few minutes.

According to an embodiment, the pressure is modified by reducing it simultaneously with a temperature variation. According to an embodiment, after reaching a predetermined temperature T2 without the infiltration having occurred, the pressure is reduced and simultaneously the temperature is increased or lowered to obtain particular effects such as for example reducing the exothermic reactions.

Further embodiments and advantages will be clear from the description outlined hereinafter of some embodiments of the invention, provided solely by way of non-limiting example in the following description.

The constructional and functional characteristics of the plant according to the present invention, as well as the characteristics of the method according to the present invention, will be clearer from the description outlined hereinafter with reference to the attached drawings representing some preferred exemplifying and non-limiting embodiments, wherein:

FIG. 1 schematically represents a plant according to the invention;

FIG. 2 schematically represents a part of the plant according to the invention wherein there are outlined the steps of supplying heat to the crucible, as well as the exothermicity of the reaction;

FIG. 3 represents, for a material made of carbon matrix with carbon fibres or CCM, a Cartesian chart bearing a curve dividing the plane delimited by an axis of the abscissae indicating the temperatures and an axis of the ordinates indicating the pressure in two areas, a first area where the pressure and temperature conditions do not allow the occurrence of infiltration and a second area where the pressure and temperature conditions allow the occurrence of the infiltration of the second material in the first material;

Figure 1:
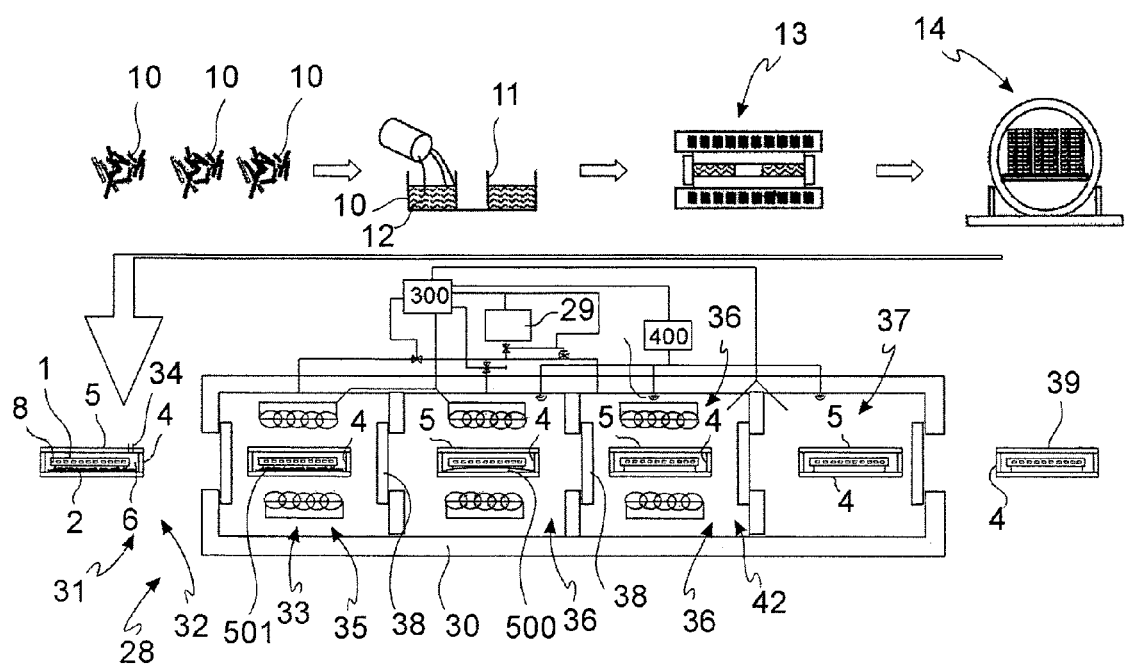
Figure 2:
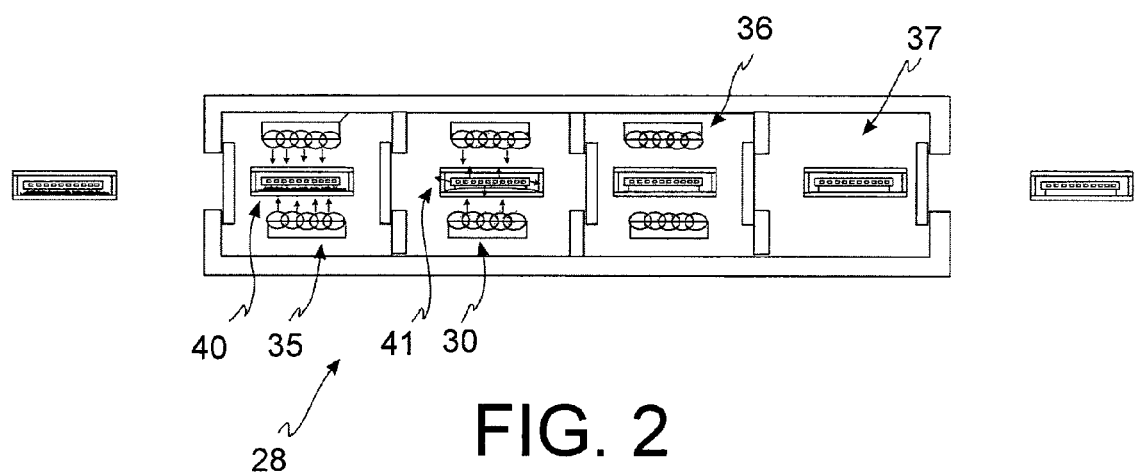
Figure 3:
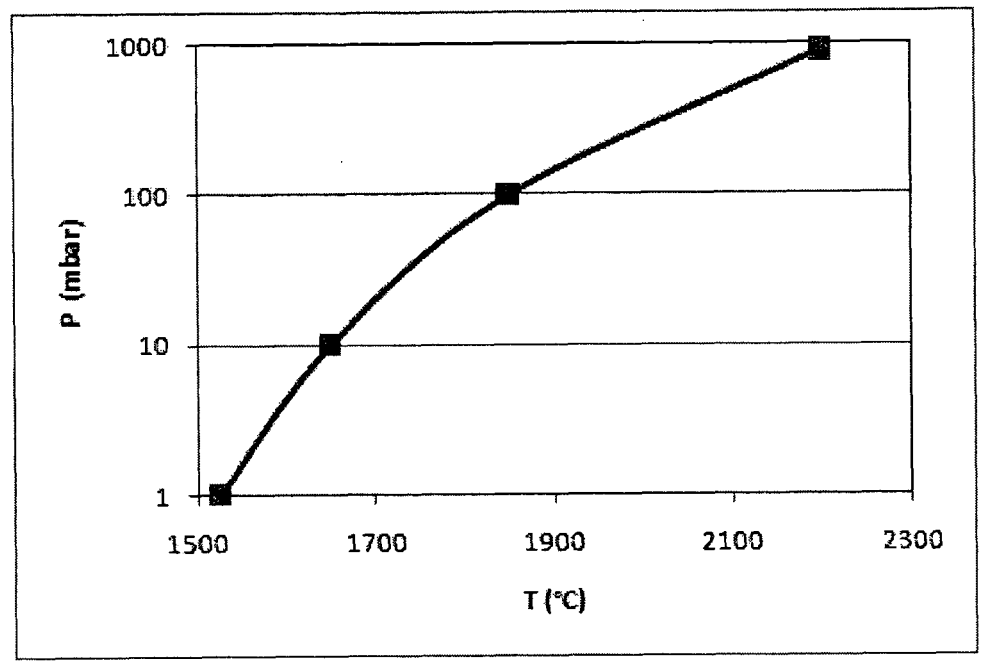
Figure 4:
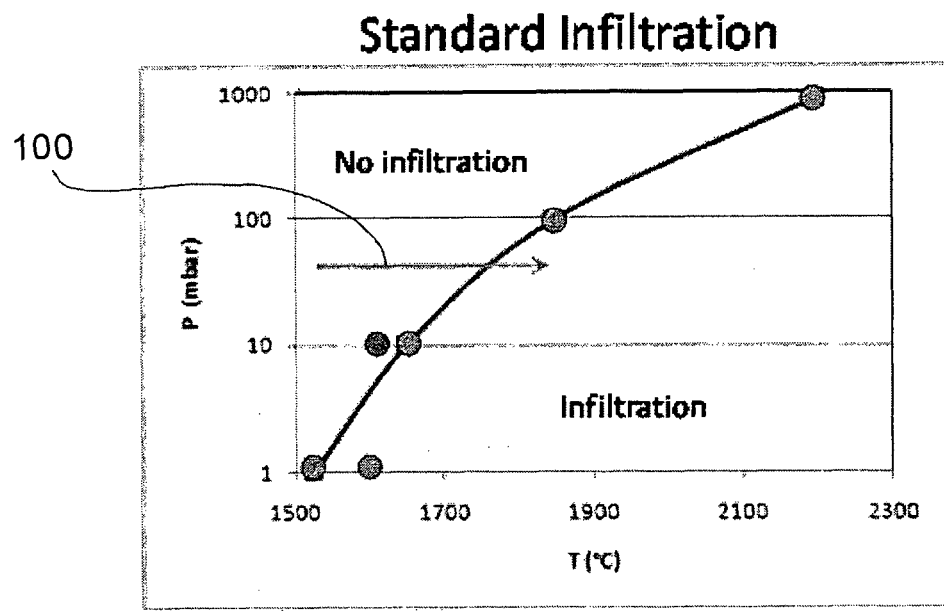
FIG. 4 represents a curve similar to that of FIG. 3 wherein there is indicated an infiltration process according to the prior art with the arrow having reference 100.
Figure 5:
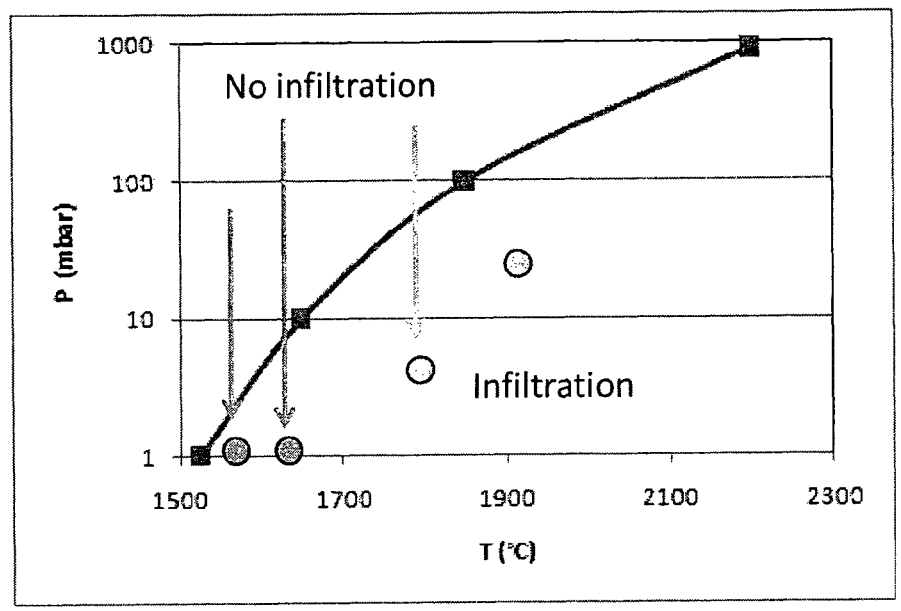
FIG. 5 represents a chart similar to that of FIG. 3, wherein there are highlighted the pressure and temperature state according to the method and the plant of the present invention.
Figure 6:
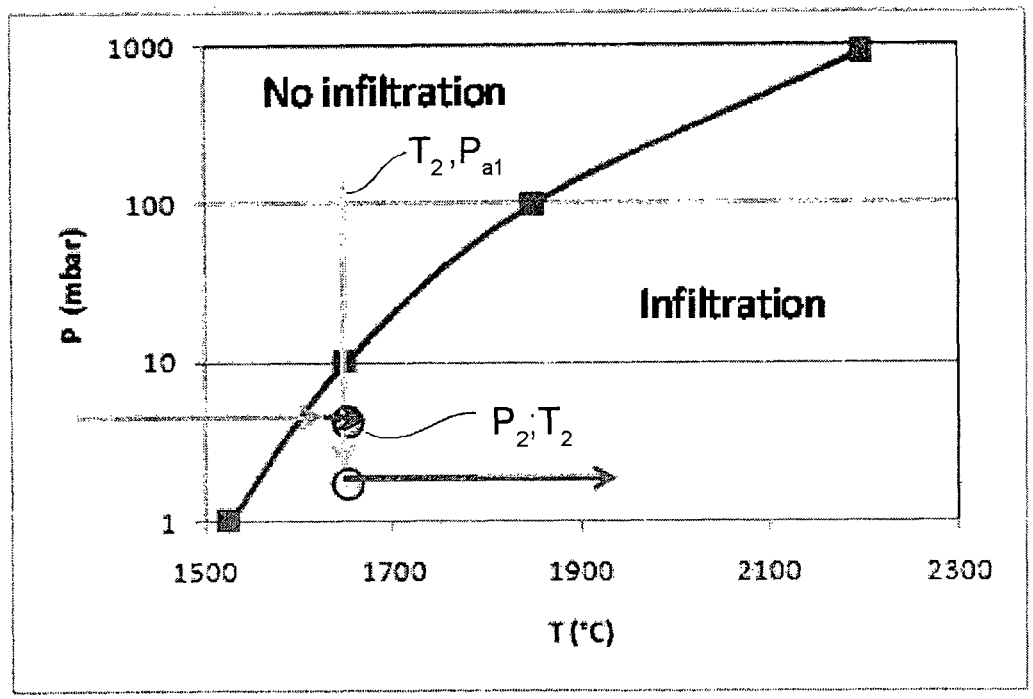
FIG. 6 represents in a chart similar to that of FIG. 3 a comparison between the method according to the state of the art and the method according to the present invention, wherein there is also highlighted the step of exothermicity (arrow 200) of the possible reaction between the second material and the first material constituting the piece.
Figure 7:
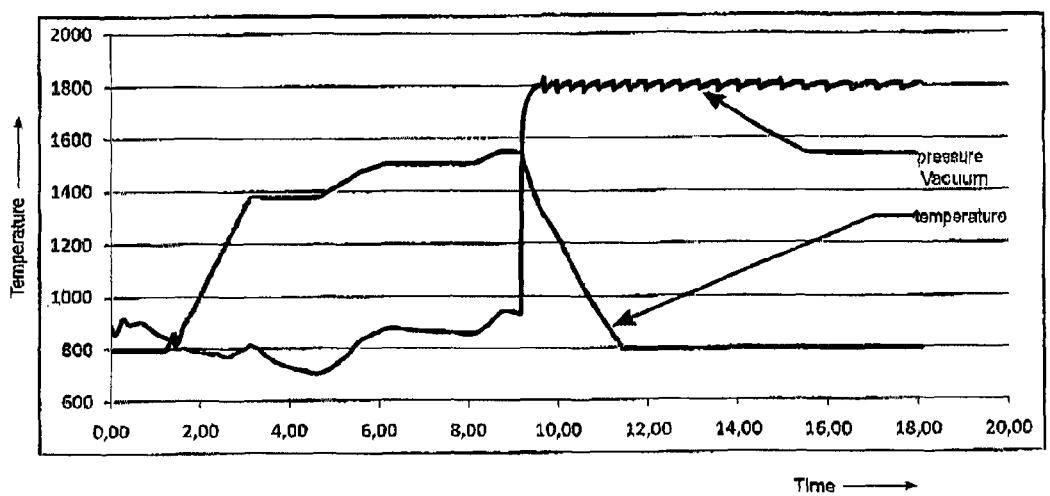
FIG. 7 represents a chart indicating in abscissa the time and in ordinate the temperatures and the vacuum wherein there are represented the curves of an infiltration process according to the state of the art.
Figure 8A:
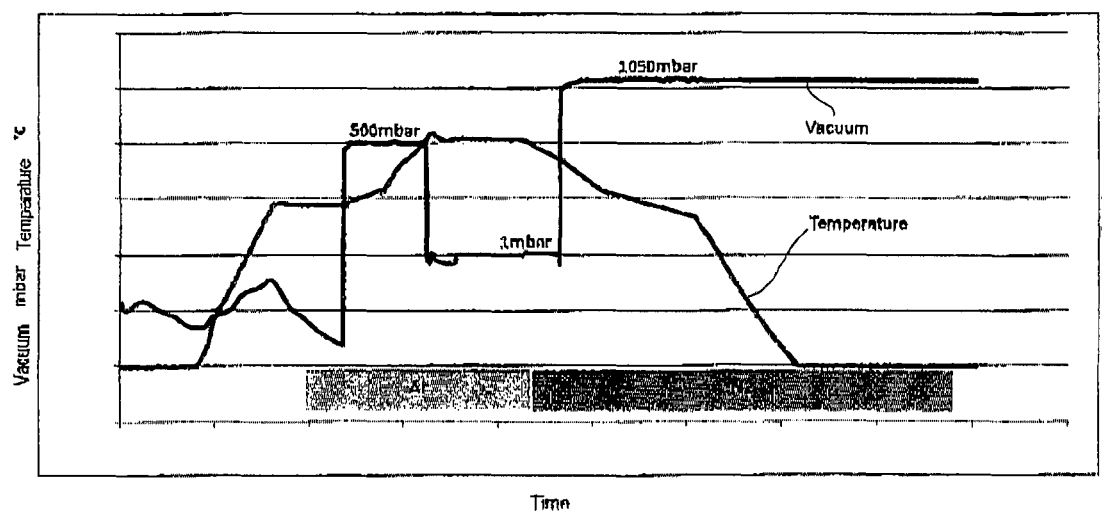
FIG. 8a represents in a chart indicating in abscissa the time and in ordinates the temperature and the vacuum, two curves representing the process according to the present invention, for a non-in-line furnace, preferably of the batch or static type.
Figure 8B:
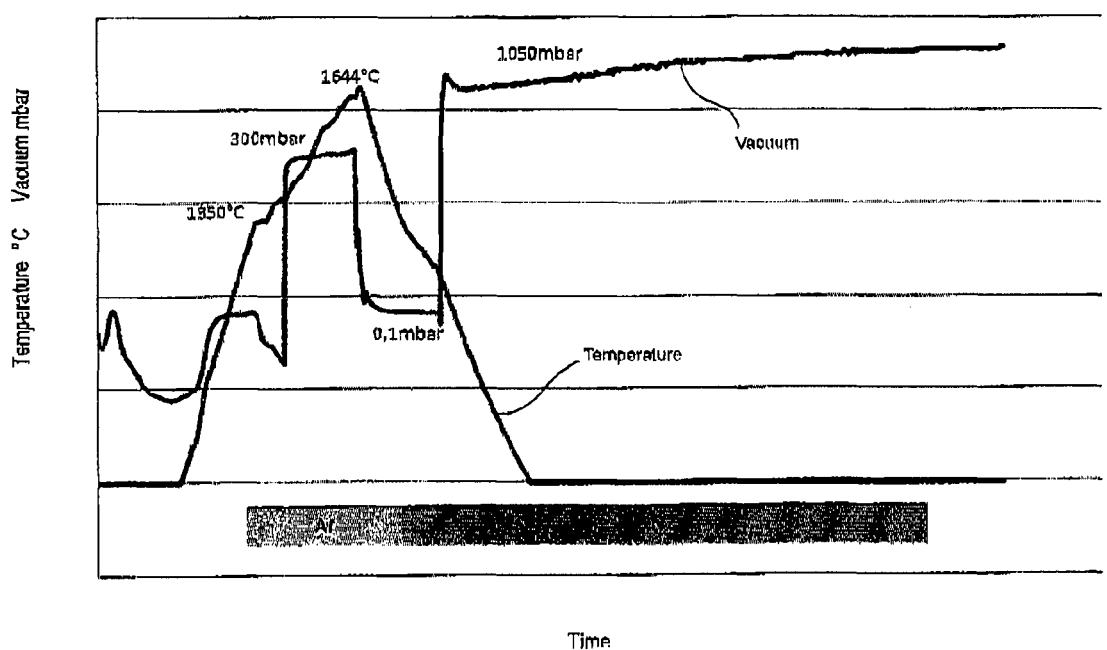
Figures 9, 10:
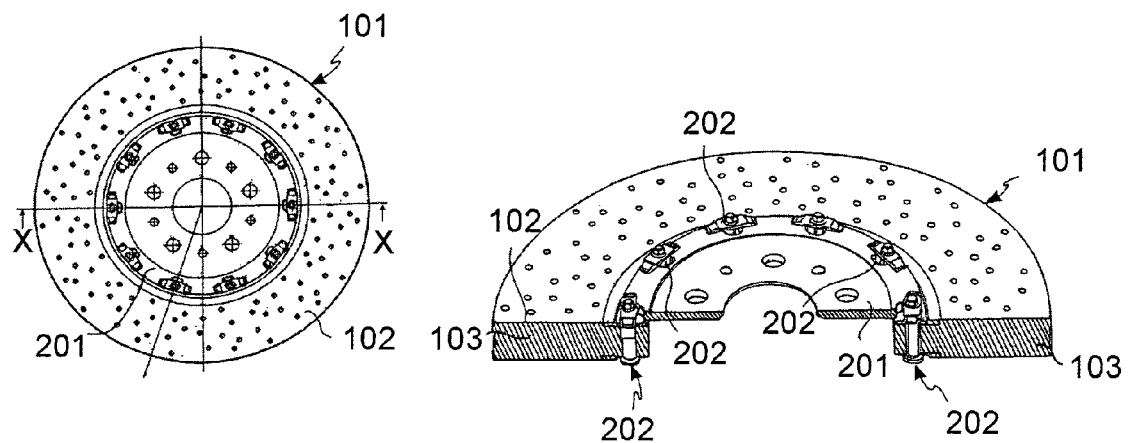
Figure 11:
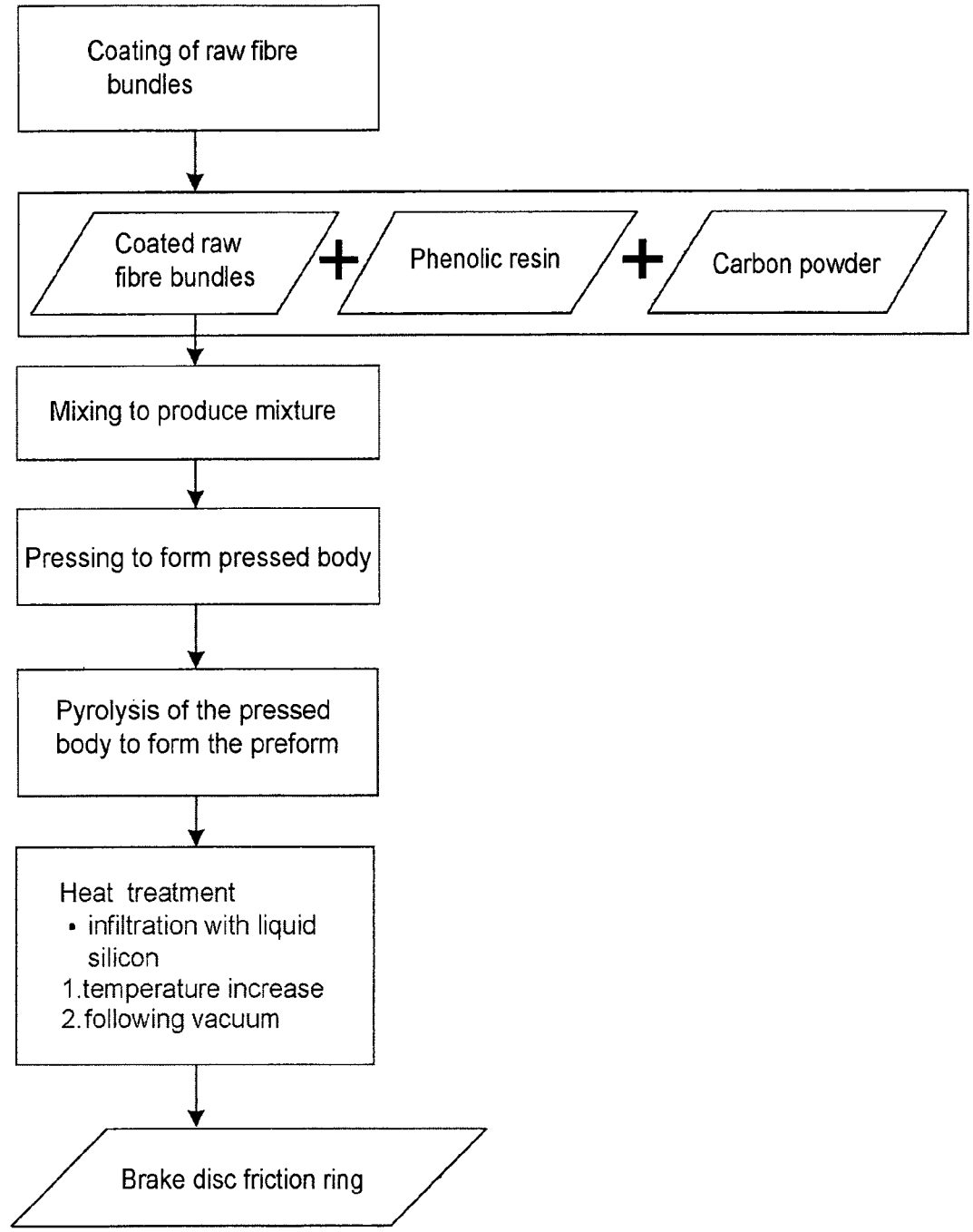
Figure 12:
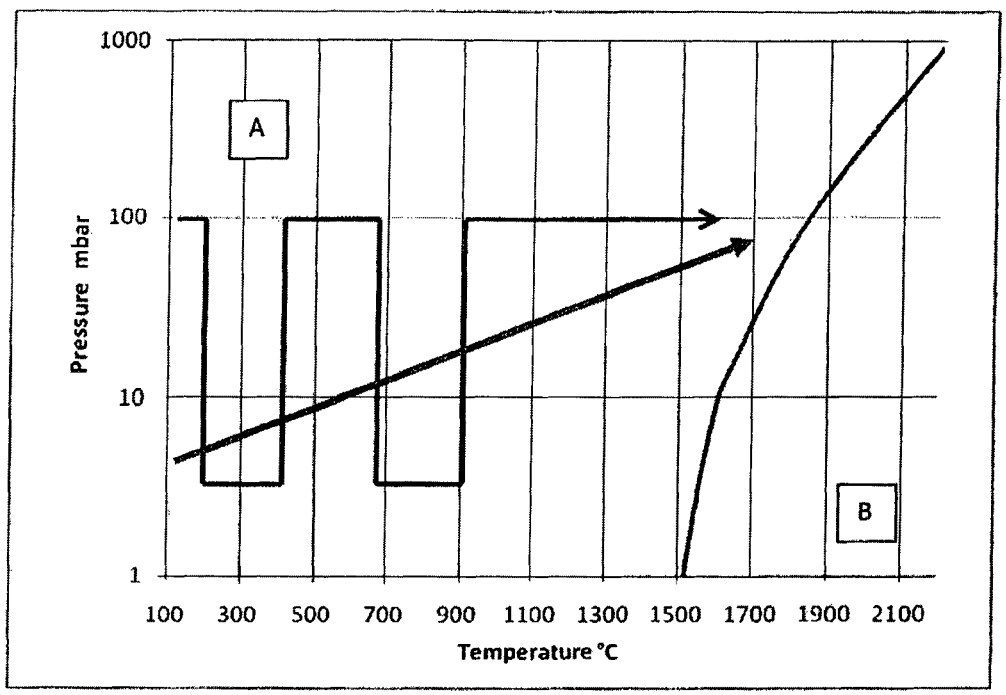
Figure 13:
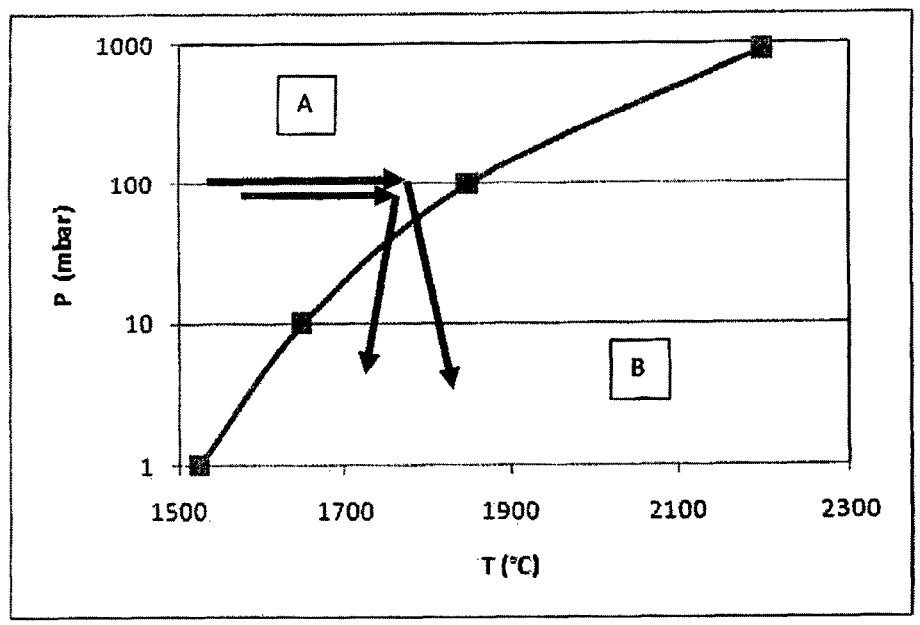

FIG. 8b, in a chart indicating in abscissa the time and in ordinates the temperature and the vacuum, two curves representing the process according to the present invention, preferably for an in-line furnace;

FIG. 9 and FIG. 10 represent a piece made of a first material infiltrated with a second material, in which FIG. 9 is a front view and FIG. 10 is an axonometric view sectioned according to line X-X of FIG. 9;

FIG. 11 represents a flow-chart regarding a method for producing a piece according to the invention;

FIGS. 12 and 13 represent for a porous matrix material, Cartesian charts indicating curves dividing the respective plane, delimited by an axis of the abscissae indicating the temperatures and an axis of the ordinates indicating the pressure, into two areas, a first area marked with letter "A" where the pressure and temperature conditions do not allow the occurrence of infiltration of a second material in the porous matrix of the first, and a second area marked with letter "B" where the pressure and temperature conditions allow the occurrence of infiltration of the second material in the first material, these charts bearing paths, indicated with arrows, representing the variation of state of the first and second material upon the variation of the temperature and pressure thereof.

As observable from the attached figures and according to a general embodiment, a method for treating a piece 1 made of a first porous material 8 with a second material 2 when this second material is in liquid state, wherein said second material is suitable for infiltration when it is in a predetermined temperature range DTi and a predetermined infiltration pressure range Dpi, comprises the steps of:

providing a crucible 4 suitable for containing the piece 1 and the second material 2 and capable of withstanding the temperatures and pressures for the infiltration of the second material 2 in the piece 1;

providing a cover 5 for the crucible 4 suitable for closing the crucible creating a chamber 6 inside the crucible;

placing the piece 1 and the second material 2 in said crucible chamber 6, when this second material is not yet in liquid state;

subsequently closing the crucible 4 with the cover 5.

Advantageously, according to an embodiment, said method comprises the further step, at a pressure pa or pa1, unsuitable for the infiltrations of the second material in the first porous material, raising the temperature of the piece 1 and the second material 2 contained in the crucible up to a predetermined temperature T2 suitable for liquefying said second material 2 for making it suitable for infiltration in said piece 1 in the first porous material.

According to an embodiment, after the preceding step, for example but not necessarily without supplying energy for increasing the temperature T2, lowering the pressure to a predetermined pressure value p2 lower than the previous pressure pa or pa1 and allow the infiltration of the second material 2 in said piece 1 made of first porous material 8.

According to an embodiment, said step of placing the piece 1 and the second material 2 in said crucible chamber 6 occurs at ambient pressure Pa.

According to an embodiment, said second material 2 is selected so as to determine a reaction with said first material 8 when infiltrated in said porous material. According to an embodiment, said second material does not react with said first material, for example in the case of silicon carbide porous matrix infiltrated with molten silicon.

According to an embodiment, said second material 2 is selected so as to be capable of reacting with the first material of the piece 8 forming at least locally a compound 3 when it is infiltrated in said first material piece.

According to an embodiment, there is provided for the further step of providing a cover 5 for the crucible 4 suitable for sealing the crucible creating a chamber 6 inside the crucible in which it is possible to adjust the temperature T and the pressure P.

According to an embodiment, said second material 2 is added in the crucible chamber 6 in form of powder and/or granules. According to an embodiment, said second material 2 is silicon.

According to an embodiment, said cover 5 for the crucible 4 is suitable for extracting gas and creating vacuum in said crucible chamber 6.

According to an embodiment, said step of placing the piece 1 and the second material 2 in said crucible chamber 6 occurs at ambient temperature Ta, when this second material is not yet in liquid state.

According to an embodiment, before the step of raising the temperature of the piece of the second material at a pressure unsuitable for infiltration of the second material in the piece, it is provided for the step of preheating the piece and the second material. For example, but not necessarily, it is provided for the step of preheating the piece and the material to 1600° C. and a pressure not below 100-300 mbars.

According to an embodiment, before the step of lowering the pressure to determine the infiltration of the second material in the porous matrix of the first material, and before the step of raising the temperature at a pressure unsuitable for infiltration, it is provided for the step of lowering the pressure p of the chamber 6 inside the crucible up to a predetermined pressure value p1 lower than the ambient pressure pa with the aim of evacuating from the crucible 4 substances possibly present in the ambient area which could influence the method. For example, but not necessarily, this step is provided at a temperature unsuitable for infiltration, and/or preferably at a pressure unsuitable for infiltration.

According to an embodiment, before the step of raising the temperature at a pressure unsuitable for infiltration it is provided for the step of introducing gas at least into the crucible chamber, such as for example nitrogen, preferably argon.

According to an embodiment, after the step of raising the temperature at a pressure unsuitable for infiltration, there is provided for a further step of raising to a temperature variable between 1550 and 1950 and preferably of 1600-1650° C. and subsequently lowering the pressure to 10 mbars or 1 mbar, preferably 0.1 mbar (millibars). According to an embodiment, after the step of raising the temperature at a pressure unsuitable for infiltration and without supplying energy for increasing the temperature T2, but exploiting the exothermicity of the infiltration reaction, lowering the pressure to a predetermined pressure value p2 lower than the previous pressure pa or pa1 so as to allow the infiltration of the second material 2 in said piece 1 made of first porous material 8.

According to an embodiment, before the step of raising the temperature it is provided for the step of closing the crucible with a cover which allows exploiting the exothermicity of the infiltration reaction of the second material in the first porous material, allowing a further temperature rise in the crucible chamber not induced from outside of the crucible.

According to an embodiment, after the infiltration step there is provided for a step of raising the pressure.

According to an embodiment, after the infiltration there is provided for a step of controlled cooling in an argon and/or nitrogen gas environment, preferably in nitrogen. According to an embodiment, said cooling step is provided with a cooling ramp moving from the maximum temperature used in the process up to 1000° C., for example from 1800° C. to 1000° C.

According to an embodiment, after the infiltration step the crucible chamber 6 is brought to ambient pressure pa or however to a pressure p1 at which the infiltration of the second material 2 in the piece 1 cannot occur regarding all temperature values of the method described herein. According to an embodiment, the pressure is first increased to 150-100 mbars after the infiltration and during cooling and subsequently brought to ambient pressure pa.

According to an embodiment, after the infiltration the pressure is raised up to said ambient pressure pa or to a pressure at which infiltration pa1 does not occur.

According to an embodiment, after the infiltration step it is provided for the step of lowering the temperature to a predetermined temperature T3 so that there occurs the solidification of the second material infiltrated in the first material. According to an embodiment, after the infiltration step it is provided for the step of lowering the temperature to a predetermined temperature T3 so that there occurs the solidification of the second material at least partly bound to the first material in a compound 3. According to an embodiment, said lowering of temperature at least partly occurs by injecting in said crucible chamber 6 an inert gas 7 suitable for separating from the piece said second material not infiltrated in said piece.

According to an embodiment, there is provided for a device 400 which injects in the chamber or in the chambers of the plant 28 said inert gas 7.

According to an embodiment, after of the infiltration, the temperature is lowered up to obtaining a final cooling of the infiltrated piece.

According to an embodiment, after the final cooling the infiltrated piece is unloaded removing it from the crucible chamber.

According to an embodiment, said infiltration step occurs through capillarity making the liquid of the second material placed at the base, or however around the piece placed in the crucible, to raise through the piece and/or wicks arranged between the piece and the second material, for example wicks made of porous material identical or similar to that of the piece.

According to an embodiment, said first material is made of porous carbon matrix, for example made of carbon matrix and carbon fibres.

According to an embodiment, said first material made of porous carbon matrix is obtained through pyrolysis of carbon and a binder 12, for example but not necessarily made of fibre 10 and resin 12. According to an embodiment, said resin is in liquid state. According to a preferred embodiment, said resin is in form of powder or grains.

According to an embodiment, said first material is obtained by forming, in a mould 11, carbon fibres 10 added to powder resin 12 with a heating, for example but not necessarily by means of a furnace 13, at a temperature variable between 80° and 180° C., for example in a pressing condition, for example at 5-30 bars, followed by a pyrolysis step at 900-1200° C., for example but not necessarily by means of a second furnace 14.

According to an embodiment, said second material is silicon in powder and/or in grains.

According to an embodiment, before the step of heating at a pressure unsuitable for infiltration there is provided for a step of preheating 35 lowering the pressure in the crucible chamber without infiltration occurring and/or a pressure suitable to allow a rapid pressure gradient at the pressure suitable for the infiltration, for example for facilitating the passage of the crucible to the furnace 30 and a rapid, subsequent vacuum creation up to reaching 10-1-0.1 mbars.

According to an embodiment, among the different steps of the method there is provided for a low temperature gradient and/or a low pressure gradient, so as to rapidly facilitate the passage of the crucible from one state to the subsequent one of the method.

According to a general embodiment, a plant 28 for treating a piece 1 made of a first porous material 8 with a second material 2 when this second material is in liquid state, comprises:

said piece to be infiltrated 1 made of a first porous material 8;

said second material 2 suitable for infiltration when in a predetermined temperature range DTi and predetermined infiltration pressure range Dti;

a crucible 4 having a crucible chamber 6 containing said piece 1 and said second material 2;

a crucible cover 5 which closes the crucible delimiting said inner chamber 6;

at least one vacuum creating device 29 for reducing the pressure up to an infiltration pressure p2 suitable for the infiltration of the second material 2 when in liquid state at the infiltration temperature T2;

a furnace 30 for increasing the temperature up to an infiltration temperature T2 suitable for the infiltration of the second material 2 when in liquid state at the infiltration pressure p2.

According to an embodiment, said plant further comprises a station 31 wherein said piece 1 and said second material 2 are introduced into said crucible chamber 6, a heating station 35 wherein said crucible 4 is introduced into said furnace 30 for raising the temperature of the crucible chamber 6 when the vacuum creating device 29 is not operating to bring the pressure to an infiltration pressure and maintaining the temperature of the crucible chamber 6 when the vacuum creating device 29 becomes operative and lowers the pressure to the predetermined infiltration pressure p2.

Advantageously, according to an embodiment, said plant further comprises a control device 300 which regulates the temperature of the furnace up to an infiltration temperature T2 and only subsequently adjusts the pressure lowering it until it reaches an infiltration pressure p2.

According to an embodiment, said second material is a material capable of reacting with the material of the piece forming at least locally a compound 3 when is infiltrated therein.

According to an embodiment, said crucible has at least one opening 34 for the connection of the crucible chamber 6 for the fluidic connection with a vacuum creating device 29.

According to an embodiment, said crucible inner chamber is closed by a cover which allows exploiting the exothermicity of the reaction between the second material and the first material allowing a further temperature rise in the piece and/or in the chamber not induced from outside.

According to an embodiment, there is provided for a sealing station 32 wherein said crucible 4 is closed by said crucible cover 5. According to an embodiment, there is provided for a cleaning station 33 wherein at least one vacuum creating device 29 is connected to bring the pressure at least in the crucible chamber to a pressure suitable for cleaning the crucible chamber from gases unsuitable for the infiltration process.

According to an embodiment, said furnace is provided with a plant suitable for creating vacuum in the furnace chamber and/or at least in the crucible chamber.

According to an embodiment, said stations for loading the piece into the crucible and the heating of the crucible coincide.

According to an embodiment, there is provided for an injection station 36 for the injection in said crucible chamber 6 of an inert gas 7.

According to an embodiment, it is provided for the injection of a reactive gas suitable for separating the second material 2 not infiltrated in the piece 1 from said piece and from the crucible 4.

According to an embodiment, there is provided for a cooling station 37 in which the temperature of the crucible chamber 6 is lowered according for example to a predetermined temperature lowering rule.

According to an embodiment, there is provided for a preheating station which coincides with the furnace.

According to an embodiment, the doors delimiting the heating station and/or the furnace are arranged outside the furnace chamber so as to facilitate the air filtration seal in the furnace chamber upon lowering the pressure of the furnace chamber.

According to an embodiment, there is provided for a controlled cooling station 42.

According to an embodiment, there is provided for a further final cooling station 37.

According to an embodiment, there is provided for a further station for removing the infiltrated piece 39.

Hereinafter, the term "ceramic composite structure" shall be used to indicate all the structures obtained by:

carbonising any pre-form comprising resins, for example phenolic resins, graphite, for example in powder form, and filaments or bundles of carbon fibre filaments and densifying the obtained porous structure through infiltration of silicon, obtaining a structure matrix or matrix comprising Carbon (C), Silicon (Si) and Silicon Carbide (SiC).

According to an embodiment, a disc-brake-disc 101, comprises a braking band 102 adapted to cooperate with brake callipers to exert a braking action on a vehicle.

With reference to FIGS. 9 and 10, the aforementioned braking band comprises a body 103 which extends around a symmetry axis X-X and it is laterally delimited by braking surfaces 104.

According to an embodiment said body is made of shaped composite material based on carbon/silicon carbide (from now henceforth "C/SiC") and containing filaments essentially constituted by carbon.

Advantageously, said body comprises a structure or porous carbon matrix infiltrated with silicon to form silicon carbide and excess silicon, as well as remaining carbon.

Preferably, said body is obtained from the interaction of a pre-form, comprising filament bundles essentially constituted by carbon 10, with silicon 2 at a temperature sufficient to cause the melting of said silicon in the latter.

The term "filaments essentially constituted by carbon" is used to indicate fibrous materials obtained by means of pyrolysis of various products of synthetic origin, for example, polyacrylonitrile (PAN) and polysilazane, or of natural origin, for example, pitches, natural sources based on cellulose such as vegetable fibre and wood.

The term "filament bundles" is intended to comprise sets of filaments variable from 3000 to 50000 units and having a diameter comprised between 2 and 310 μm, preferably 7 μm associated to each other and preferably, impregnated with a resin, for example polyurethane.

Advantageously, said bundles are broken, so as to have a length shorter than 30 mm, preferably variable from 10 to 8 mm, and are randomly arranged into the mixture so as to be randomly arranged in the preform.

These filament bundles randomly arranged are defined on the basis of the number of component units of the bundle, for example 3K, 10K, 50K respectively correspond to 3000, 10000 and 50000 units, and so on.

According to an embodiment, the process for making a braking band composite structure of a brake disc comprises the following operating steps:
  making the composite ceramic structure of the braking band body;
  mechanically machining the aforementioned body to remove a surface layer of the braking surface, advantageously but not necessarily providing two opposite braking surfaces planar and parallel to each other.

According to an embodiment, to the aforementioned steps there are added the following steps of:
  removing the surface carbon not bonded to silicon from the aforementioned braking surfaces;
  depositing a protective coating on the aforementioned braking surfaces; and
  mechanically finishing the aforementioned braking surfaces.

Advantageously, the mechanical finishing step allows obtaining at least one of the following advantages:
  reduction of the thickness of the protective coating layer;
  predetermined surface roughness value;
  planarity of the braking surface;
  parallelism between the opposite braking surfaces;
  drilling of the braking surface.

Preferably, the mechanical finishing step is followed by an assembling step, for example by means of fastening means 202, of the braking band to a support and traction bell 201 for the connection of the braking disc thus obtained to a vehicle.

With reference to FIGS. 9 and 10 and according to an embodiment, a disc-brake-disc is indicated in its entirety with 101. The disc 101 develops around a symmetry axis X-X. Said symmetry axis X-X also constitutes the rotational axis of the brake disc 101. The disc 101 comprises a braking band 102. According to an embodiment, said braking band comprises two pads connected to each other by means of connection elements.

The braking band 102 is supported by a bell 201 by means of fittings or fastening means 202 which can be configured so as to provide a piece connection or, alternatively, a mobile and/or removable connection between the bell and the braking band.

The bell 201 is arranged at the centre of the brake disc 101 and it can be coupled through connection means to a wheel hub of a vehicle. The pads comprise an outer surface and an inner surface, opposite to the outer surface. The outer surfaces of the pads constitute the friction surface of the brake disc. The inner surfaces of the pads delimit a ventilation conduit extending from an inlet opening, arranged at an edge radially internal with respect to the braking band 102, and an outlet opening, arranged at a side radially external with respect to the braking band. The indications "radially internal" and "radially external" refer to the symmetry axis X-X corresponding to the rotational axis of the brake disc 101 and the braking band 102 thereof.

Preferably, the step of making the composite ceramic structure of the braking band body provides at least for the following sub-steps:
  preparation of a mixture comprising at least carbon fibre filaments 10 and at least an organic binder 12;
  forming in a mould 11 of the aforementioned mixture to obtain a shaped body;
  pyrolysis of the shaped body to obtain a porous carbon structure;
  silicon infiltration of the carbon structure to obtain the aforementioned ceramic composite structure substantially based on carbon, silicon and silicon carbides, according to the method outlined above of raising in advance the temperature at a pressure unsuitable for infiltration and only subsequently lowering the pressure at a pressure suitable for the infiltration.

Preferably, but not necessarily, the silicon infiltration step is followed by a step of depositing a layer of antioxidant material on the entire surface of the shaped body.

According to an embodiment, in the aforementioned step of preparation of the mixture filament bundles of carbon with at least an organic binder are mixed to each other.

Advantageously, the filament bundles may have a diameter ranging between 0.1 mm to 2 mm, preferably between 0.3 mm and 0.5 mm.

Advantageously, the content of filament bundles in the mixture can vary from 30% to 70% by weight on the weight of the mixture and it is preferably in the range comprised between 40% and 60% and, even more preferably in the range comprised between 50% and 60%, for example 56%.

The organic binder 12 is a conventional binder which can be chosen from the group comprising phenolic and acrylic resins, paraffin, pitches, polystyrenes, etc.

Preferably the binder is selected from the group comprising pitches and phenolic resins.

The binder can be added to the mixture in any desired form for example at solid state, preferably in the form of powder or grains, semi-liquid, liquid or solution. For example, the phenolic resin can be added in the form of pellets, powder or grains.

Advantageously, the content of organic binder in the mixture may vary from 5% to 50% by weight on the weight of the mixture and is preferably comprised in the range between 20% and 40%. Advantageously, the content of organic binder in the mixture is of 37%.

The mixture may also contain other conventional additives used as fillers and, indirectly, for regulating the porosity and the density of the composite structure. Such additives consist of particles of inorganic materials such as preferably graphite powder, silicon carbide, metal nitrides and carbides, silicon or milled fibre.

Advantageously, the content of additives in the mixture may vary from 0% to 20% by weight on the weight of the mixture and is preferably comprised in the range of 5%-15%. Advantageously, the content of additives in the mixture is of 7%.

The mixing can be carried out using conventional equipment and methods and the aforementioned filament bundles will be randomly arranged in the different directions. The mixture thus obtained is then arranged in a mould 11 where it is formed by heating and application of a pressure, obtaining a shaped body.

Advantageously, in the forming step, the mixture is heated in the mould at a temperature ranging between 80° C. and 180° C., preferably 140-160° C. and a pressure comprised between 5 bars and 50 bars, preferably between 5 bars and 25 bars, is applied thereon.

The shaped and compact body thus obtained is extracted from the mould and then subjected to a first firing with the aim of carbonising the chemical binder (pyrolysis).

Such firing, for example, is carried out in a conventional furnace 14 at a temperature that substantially depends on the type of binder used and that is generally comprised in the range within 900-1200° C.

According to an embodiment, the firing is carried out in the presence of a flow of inert gas such as nitrogen or argon and with a pressure comprised in the range between 2 mbars and 100 mbars, preferably between 20 and 30 mbars. The aforementioned flow also advantageously allows removing the gases released from the pyrolysis of the chemical binder.

Due to such first firing (pyrolysis), the semi-finished product acquires certain porosity due to the loss of volatile material at the carbonisation or pyrolysis temperatures and it is transformed into a porous carbon structure.

Advantageously, there can be further provided for a step for finishing the surface of the shaped body at the end of the pyrolysis firing. This advantageously allows removing any surface deformations of the body by conventional equipment, so as to obtain the desired shape. According to an embodiment, the finishing operation is preferably carried out in a dry manner, for example using diamond tools.

Subsequently, the porous carbon structure is subjected to a second firing in presence of silicon 501 (silicon infiltration), as described previously, in particular providing for a prior step of heating at a temperature such to cause the melting of the silicon 500, but at a pressure unsuitable for infiltration, followed by a vacuum step which leads to a pressure suitable for the infiltration, so that there occurs the infiltration of the silicon liquid 500 in the pores of the aforementioned structure, thus obtaining a composite ceramic structure.

To carry out the second firing, the pyrolysed shaped body is introduced in the chamber of a container, a crucible 4, for example with a volume about twice the volume of the body itself, filling the air space formed between the body and the silicon container, which encloses the semi-finished product, for example silicon in form of grains 501. Thus, the amount of silicon used is that required, or a bit higher, for filling the porosities of the semi-finished product.

Pure silicon or an alloy of silicon and aluminium or copper, in form of grains or powder 501, is used for filling the above air space.

The chamber may be in communication with the exterior through suitable holes that allow the escape of the gases released during the firing and the creation of vacuum in the crucible chamber 6.

After adding silicon 501, the container is introduced into a special furnace 30, as described above, heated at a temperature of 1400-1800° C. At the aforementioned temperatures, the silicon melts 501 and, only after the creation of vacuum, it is infiltrated into the pores of the semi-finished product.

The vacuum is brought to a residual pressure comprised between 0.1 mbar and 10 mbars, preferably between 0.3 and 2 mbars.

At the end of the firing, the composite material is cooled for example with argon or, preferably, with nitrogen, so that the residual silicon solidifies into small balls 501 easy to recover from the container.

Silicon infiltration allows increasing the cohesion of the filament bundles of carbon, while at the same time the molten silicon, in the conditions of the second firing, partly reacts with the carbon of the semi-finished product forming silicon carbides which have the effect of improving the cohesion characteristics of the material.

At the end of this step, according to an embodiment, the semi-finished product will also have a skin-like silicon layer covering the entire outer surface thereof.

Advantageously, the firing steps in the furnace, that is, pyrolysis and silication as described above, may be carried out in a single furnace, allowing reducing time and complexity of the production equipment, but making the plant poorly adapted to machining in series.

According to a further embodiment of the process, making the composite ceramic structure of the braking band body provides for that a plurality of reinforcement fibres be incorporated in the mixture of filaments and organic binder. Such fibres are arranged so that they extend along the profile of said body for preventing the propagation of cracks due to the stresses to which the body of the piece is subjected during the operation.

Advantageously, these reinforcement fibres exhibit a length of more than 25 mm and preferably of more than 35 mm. For example, these reinforcement fibres extend along the entire profile of the geometrical area of likely formation of cracks and/or flaws, such as seat shaped areas for connecting the braking band to the bell, or even to form one or more rings concentric to the rotational axis of the disc X-X.

The content of the composite material components may vary in percentage by weight on the weight of the material, for example, as follows:
  filament bundles 40-65%, preferably 50-60%, even more preferably 56%;
  binder 5-45%, preferably 35-40%, even more preferably 37%;
  additives 0-20%, preferably 5-15%, even more preferably 7%, using powders such as for example SiC and/or Si and/or Graphite and/or milled fibre
  reinforcement fibres 0-30%, preferably 10-20%.

Advantageously, the reinforcement fibres are arranged in the mixture of filaments and binder directly into the mould, prior to the forming step.

Advantageously, such reinforcement fibres can be arranged along annular portions, for example increasing, of said disc, for example and preferably in the proximity of the inner coupling diameter between the braking band and the bell.

Advantageously, the reinforcement fibres are substantially inert with respect to the components of the composite and they reveal sufficient resistance at the pyrolysis and silicon infiltration temperatures to prevent them from degrading during the preparation of the material constituting the disc.

For such purpose, the material of the reinforcement fibres is preferably constituted by carbon fibres. Other materials such as SiC, Si3N4, TiC, as well as metal materials, for example platinum, suitable to bear the temperatures of interaction with silicon, may be used.

The reinforcement fibres may be incorporated in the material in various ways. For example, the reinforcement fibres may be sorted in a plurality of bundles which are arranged according to predefined directions.

Such directions can for example be weft and warp directions, said bundles forming a fabric, for example advantageously suitable for covering the entire area concerned by the crack formation and/or propagation.

Alternatively, the reinforcement fibres may constitute a non-woven fabric, for example felt.

The reinforcement fibres may also constitute one or more inner layers of the disc body, layers that advantageously but in a non-limiting manner can be parallel to at least one of the braking surfaces and/or transversal to at least one braking surface.

The filament bundles and/or the reinforcing fibres can be coated in advance with a protective resin, preferably polyurethane, before being used in accordance with the process described above.

Alternatively, the filament bundles and the reinforcement fibres can be coated in advance using the same organic binder used to prepare the mixture.

This allows obtaining a higher cohesion of the material and a more compact product.

During the pyrolysis of the shaped body, the resin and the organic binder carbonise creating a protective layer on the filament bundles and on the reinforcing fibres, preventing any disgregation thereof or even dissolution in the subsequent treatment with silicon.

Thus, the filament bundles and the reinforcement fibres maintain their original shape in the entire process thus obtaining a material with good cohesion and resistance characteristics.

Advantageously, the incorporation of the reinforcement fibres in the mixture may occur in various manners.

According to a preferred embodiment, such incorporation is carried out according to the steps of:
i) arranging a first layer of said mixture along the profile of said mould;
ii) adding on said first layer of mixture said plurality of reinforcement fibres that extend along said profile so as to hinder the propagation of cracks;
iii) arranging a second layer of said mixture on said first layer so as to completely cover said plurality of reinforcement fibres.

The stratification operations described above can be repeated a given number of times so as to obtain a multi-layer composite material wherein each layer of reinforcement fibres is incorporated between two layers of mixture comprising filament bundles.

The reinforcement fibres can be added to the mixture in form a of a plurality of bundles that are arranged according to predetermined directions.

Such predetermined directions can for example be weft and warp directions, said bundles thus forming a fabric. As an alternative, multiple bundles of reinforcement fibres associated or woven to each other form a single weft or warp thread for making said fabric.

The fabric can for example comprise 2 to 30 bundles of reinforcement fibres per cm, preferably 5-8 bundles of fibre/cm.

Alternatively, the reinforcement fibres may constitute a non-woven fabric, for example felt.

The amount of reinforcing fibres incorporated in the mixture depends on the reinforcement fibres content desired in the final composite material, said content being comprised for example in the range of 4-30% in volume on the volume of the material, preferably 10-20%.

EXAMPLE 1

Below is an example of preparation of the composite material according to an embodiment of the process for producing a braking band composite structure of a brake disc according to the invention.

There was prepared using a mixer of the known type, for example an Eirich mixer, a mixture containing (percentages in weight referred to the weight of the mixture) 56% of carbon filament bundles, having diameters comprised between 0.3 mm and 0.5 mm and in form of chops, 37% of dry phenolic resin, and 7% of SiC powder.

The mixture allowed obtaining a random distribution of the filament bundles.

A part of the mixture was thus arranged in the cavity of a ring-shaped mould with interior diameter of 250 mm and height of 50 mm.

The mixture was thus formed by heating the mould up to a temperature of 100° C. and by applying a pressure of 5 bars, to produce a disc-shaped "green body".

The green body was then removed from the mould and it was fired in furnace for 9 hours at the temperature of 1100° C. The firing (of pyrolysis) occurred with a pressure of 30 mbars in inert atmosphere due to a flow of argon conveyed in the furnace with a 30 litres/min flow rate.

After firing, the disc was subjected to a dry finishing, for example using diamond tools, conventionally.

At this point the green disc was arranged in a container or crucible provided with a cover and holes for the exit of gas. The container was then filled with an amount of silicon in form of granules. The container was then heated in a furnace up to a temperature of 1500° C. and left in the furnace for 2 hours. In particular the heating step was carried out at the temperature such to cause the melting of the silicon but at a pressure unsuitable for infiltration of 300 mbars. Such step was followed by a vacuum step which leads to a pressure suitable for the infiltration, in this case 1 mbar, so that there occurs the infiltration of the silicon liquid into the pores of the aforementioned structure, thus obtaining a composite ceramic structure. The vacuum step was carried out at a residual pressure of 2 mbars and, at the end of the infiltration, it was followed by cooling in the furnace by means of a continuous flow of nitrogen moving from 1650° C. to 1000° C.

The disc thus obtained, after cooling, was subjected to finishing by means of diamond tools to remove the deformations from the surface and reach the shape with the desired accuracy and tolerance.

EXAMPLE 2

Below is an example of preparation of the composite material according to an embodiment of the process for producing a braking band composite structure of a brake disc according to the invention.

There was prepared using a mixer of the known type, for example an Eirich mixer, a mixture containing (percentages in volume relative to the volume of the mixture) 65% of carbon filament bundles, having diameters comprised between 0.3 mm and 0.5 mm and length from 5 mm to 10 mm, 23% of dry phenolic resin, and 12% of SiC powder.

The mixture allowed obtaining a random distribution of the filament bundles.

A part of the mixture was then arranged in the cavity of a ring-shaped mould with interior diameter of 335 mm and height of 70 mm, to form a layer.

On the aforementioned layer there was arranged a carbon reinforcement fibre fabric, annular-shaped, conventionally prepared and having 6 fibres per cm. The reinforcement fibres of this fabric had diameters between 0.3 mm and 0.5 mm and formed bundles of 3000 units or 3K, impregnated with polyurethane.

The aforementioned fabric was thus covered with another mixture up to filling the mould.

The mixture comprising the fabric was thus formed by heating the mould up to a temperature of 100° C. and by applying a pressure of 10 bar, to produce a disc-shaped "green body".

The green body was removed from the mould and it was fired in furnace for 12 hours at the temperature of 1100° C. The firing (of pyrolysis) occurred with a pressure of 30 mbars in inert atmosphere due to a flow of argon conveyed in the furnace with a 30 litres/min flow rate.

After firing, the disc was subjected to a dry finishing, for example using diamond tools, conventionally.

At this point the green disc was arranged in a container or crucible provided with holes for the exit of gas. The container was thus filled with an amount of silicon in form of granules. The container was thus heated in the furnace up to a temperature of 1500° C. and left in the furnace for 8 hours. In particular the heating step was carried out at the temperature such to cause the melting of the silicon but at a pressure unsuitable for infiltration. Such step was followed by a vacuum step which leads to a pressure suitable for the infiltration, in this case 2 mbars, so that there occurs the infiltration of the liquid silicon into the pores of the aforementioned structure, thus obtaining a composite ceramic structure. The vacuum step was carried out at a residual pressure of 2 mbars and, at the end of the infiltration, it was followed by cooling in the furnace by means of a continuous flow of nitrogen.

The composition of the composite material, expressed as the percentages in volume with respect to the volume of the material, was the following: 55% of filament bundles, 10% of additives, 15% of reinforcement fibres and 20% of products generated by the pyrolysis of the binder.

The disc thus obtained, after cooling, was subjected to finishing by means of diamond tools to remove the deformations from the surface and reach the shape with the desired accuracy and tolerance for the successive steps to be described hereinafter.

According to another further embodiment of the process according to the invention, the preparation of the composite material provides for obtaining the final composite material providing at least two layers (a base layer and at least one surface layer) whose difference from each other essentially lies in the length of the carbon filaments used for the formation thereof.

Preferably, the shorter filaments are arranged in the surface layer so that during the silication step they can offer a greater reaction surface towards the silicon and thus leading to a final free carbon content in weight smaller than 20% with respect to the total weight of the surface layer.

Advantageously, the composite material thus obtained in addition does not have precise interfaces of separation between the various layers as a consequence of the forming process. This protects the composite material from the formation of cracks or flaws at the interface between the layers, furthermore the latter having substantially the same coefficient of thermal expansion.

Advantageously in the base layer and/or in the surface layer there can be enclosed reinforcement fibres extending along the profile of the body so as to hinder the propagation of cracks or flaws, for example according to the methods described above and/or along the directions described above.

The content of the components in the aforementioned two mixtures—expressed as the percentages in volume on the volume of the mixture—may vary, for example, as follows:
  filament bundles 50-80%;
  binder 5-30%;
  additives 0.7-23%;
  reinforcement fibres 0-30%.

The chemical binder is a conventional binder which can be selected from the group comprising phenolic and acrylic resins, paraffin, pitches, polystyrenes etc. Preferably the binder is selected from the group comprising pitches and phenolic resins.

Preferably, the binder shall be added to the mixture preferably in solid state. For example the phenolic resin may be added in form of pellets, powder or grains.

The conventional additives are used as fillers and, indirectly, with the aim of regulating the porosity and the density of the desired composite material.

Such additives are constituted by particles of inorganic materials such as preferably powder of graphite, silicon carbide, metal carbides and nitrides.

Advantageously, the filaments are in the first mixture and in the second mixture and/or the reinforcement fibres can be previously coated with a protective resin, preferably polyurethane, prior to use.

Alternatively, the filaments and/or the reinforcement fibres can be previously coated using the same chemical binder used for preparing the mixture. This allows obtaining a greater cohesion of the material and a more compact product.

During the pyrolysis firing of the shaped body, the resin and the chemical binder carbonise creating a protective layer on the filament bundles and on the reinforcement fibre, preventing possible disgregation thereof or even dissolution in the subsequent treatment with silicon. Thus, the filament bundles and the possible reinforcement fibres maintain their original shape in the entire process thus obtaining a material with good cohesion and resistance characteristics.

Advantageously, in the preparation of the second mixture, i.e. the mixture used for constituting the surface layer, one may suitably select the amount of filaments and SiC powder, the length of the carbon filaments and the grain size of the SiC powder depending on the value of coefficient of friction on the surface layer intended to be obtained at the end of silication.

In the following tables there are indicated three examples of mixtures in which there are respectively indicated the amounts of filaments and SiC powder to be used, the length of the filaments and the grain size of the SiC powder.

TABLE 1

| Type of mixture | Filaments (%) | SiC (% in the initial mixture) | Resin (%) |
| --- | --- | --- | --- |
| A | 25-60 preferably 30-40 | 1-10 preferably 2-7 | 30-75 preferably 50-65 |
| B | 10-25 preferably 10-20 | 10-15 preferably 11-13 | 60-80 preferably 65-75 |
| C | 5-10 preferably 6-8 | 15-30 preferably 18-25 | 40-70 preferably 50-65 |

TABLE 2

Variation of the length of the filaments.

| Type of mixture | Filaments (mm) |
| --- | --- |
| A | 5-8 preferably 6-7 |
| B | 1-5 preferably 2-4 |
| C | 0.1-1 preferably 0.2-0.8 |

TABLE 3

Variation of the grain size of the SiC

| Type of mixture | SiC (mm) |
| --- | --- |
| A | 0.1-0.5 preferably 0.2-0.3 |
| B | 0.05-0.2 preferably 0.1-0.15 |
| C | 0.01-0.05 preferably 0.02-0.03 |

EXAMPLE 3

Below is an example of preparation of the composite material according to the aforementioned embodiment of the process for producing a braking band composite structure of a brake disc. A first mixture containing, in percentages in volume on the volume of the mixture, 65% of carbon filaments having a diameter ranging from 0.3 mm to 0.5 mm, a length ranging from 7 mm to 10 mm, 23% of dry phenolic resin and 12% of silicon carbide powder was prepared in an Eirich mixer, conventionally.

Similarly, there was prepared a second mixture containing, in percentages in volume on the volume of the mixture, 65% of carbon filaments having a diameter ranging from 0.3 mm a 0.5 mm and a length of about 3 mm, 23% of dry phenolic resin and 12% of silicon carbide powder.

A portion of the second mixture was then arranged in the cavity of an annular mould having an interior diameter of 150 mm, exterior diameter of 335 mm and height of 102 mm in amounts such to form, in the finished product, a layer (surface layer) having the thickness of about 1 mm.

After levelling the surface thereof, on such layer there was deposited a second layer (base layer), formed from the first mixture, in amounts such to obtain, in the finished product, a thickness of about 30 mm. Even such surface was levelled.

A third layer of the second mixture in amounts such to form, in the finished product, a layer having the thickness of about 1 mm, was deposited on the second layer, so as to provide a sandwich configuration.

Subsequently, the layers of the first and of the second mixture were formed by heating the mould at a temperature of 100° C. and by applying a pressure equivalent to 5-10 bars obtaining a disc-shaped green body.

The green disc, after being removed from the mould, was subjected to firing (of pyrolysis) in a furnace heated at a temperature of 1100° C. over a period of time of 12 hours.

Firing was carried out with a pressure of 30 mbars and in inert atmosphere for the presence of argon, conveyed in the furnace with a 30 litres/minute flow.

After firing, the aforementioned disc was subjected to dry finishing with diamond conventionally with the aim of removing surface deformations.

At this point, the green disc was arranged in a container provided with holes to allow the exit of gas. The container was added with silicon in form of grains at the amounts required to fill the space formed between the disc and the container. The container was then transferred in a furnace heated at the temperature of 1800° C. and it was left in such furnace over a period of time of 5 hours and a pressure unsuitable for infiltration, in this case 300 mbars. A vacuum step with a residual pressure of 1.5 mbars was carried out only after raising the temperature, so as to allow the infiltration of the liquid silicon, followed by cooling in the furnace with continuous insufflation of nitrogen at atmospheric pressure.

The disc thus obtained, after cooling, was subjected to finishing by means of diamond tools to remove the deformations from the surface and reach the shape with the desired accuracy and tolerance for the successive machining operations described hereinafter.

Thus this disc has a microfibrous surface layer.

According to a further embodiment, there are mixed carbon filament bundles and a liquid mixture formed by graphite powder and phenolic resin dissolved in a solvent (furfuryl alcohol). The cavity of a mould is filled with the mixture thus obtained to proceed to form the material and heating thereof at a temperature of about 80-150° C. to allow the polymerization of the phenolic resin, obtaining a shaped body.

The body thus obtained is subjected to a first firing at the temperature of 1000° C. in inert atmosphere to allow the pyrolysis of the present carbon compounds and obtain a porous carbon structure.

Subsequently, a second firing with silicon in form of granules was carried out up to the temperature of about 1500-1800° C., determining the melting of the granules of silicon, but at a pressure unsuitable for infiltration. A vacuum step at about 0.2 mbars which allowed the infiltration of the molten silicon in the pyrolysed layer of the body was applied only subsequently. During this step there occurs the silication of the body with the reaction between Si and free C to form a SiC matrix.

The body thus obtained, after cooling, is subjected to finishing by means of diamond tools to remove the deformations from the surface and reach the final shape with the desired accuracy and tolerance for the successive steps.

According to a further embodiment, the preparation of the composite material provides for that, at the end of the pyrolysis firing, the pirolysed body having a porous carbon structure be impregnated with a liquid mixture capable of forming an antioxidant layer during the subsequent steps of the production process.

Preferably the liquid mixture to be applied is constituted by a phenolic resin dissolved in a solvent (for example furfuryl alcohol) added with SiC powder and fibres and/or powder of carbon. After the application of the aforementioned mixture, the semi-finished product is subjected to a slight heating (temperature between 100° C. and 200° C.) which causes the evaporation of the solvent and the polymerisation of the resin, and thus the formation of a solid layer based on SiC.

Advantageously, the pyrolysed body is repeatedly subjected to the impregnation and heating steps.

Preferably, there follows a second pyrolysis firing, substantially involving the aforementioned surface solid layer and thus the silicon infiltration of the body obtained up to now. The silication treatment transforms the aforementioned solid layer into a layer almost entirely made up of SiC.

At the end of silication the semi-finished product has a layer of SiC having a thickness comprised between 0.2 mm and 5 mm, and preferably between 0.5 mm and 2.5 mm.

Advantageously, it is possible to avoid carrying out both the second pyrolysis and the silication, leaving the surface layer with SiC obtained after the polymerisation of the resin and the binder used for impregnating the pyrolysed body unaltered.

EXAMPLE 4A

Below is a first example of preparation of the composite material according to the aforementioned embodiment of the process for producing a braking band composite structure of a brake disc according to the invention.

Carbon filament bundles 3K and a liquid mixture made up of graphite powder and phenolic resin dissolved in 1:1 ratio in furfuryl alcohol were mixed for about one hour. The filaments had a length of about 16 mm.

The cavity of an annular mould having an interior diameter of 150 mm, exterior diameter of 335 mm and height of 102 mm, was filled using the mixture thus obtained.

There followed the formation of the material and heating thereof at a temperature of about 100° C. to allow the polymerisation of the phenolic resin, obtaining a shaped body.

The body thus obtained was subjected to a first firing at the temperature of 1000° C. in inert atmosphere to allow the pyrolysis of the present carbon compounds and obtain a porous carbon structure.

Subsequently, there followed a second heating up to the temperature of 1600° C., determining the melting of added granules of silicon maintaining the pressure at a level unsuitable for infiltration, in this case 350 mbars, and thus there followed a vacuum step at a pressure of 0.3 mbars at which there occurred the infiltration of the molten silicon in the pyrolysed body. During this step there occurred the silication of the body with the reaction between the Si and the free C to form a SiC matrix.

The disc thus obtained, after cooling, is subjected to finishing by means of diamond tools to remove the deformations from the surface and reach the shape finale with the desired accuracy and tolerance for the successive machining operations.

EXAMPLE 4B

Below is a second example of preparation of the composite material according to the aforementioned embodiment of the process for producing a braking band composite structure of a brake disc according to the invention.

Carbon filament bundles 3K and a liquid mixture made up of graphite powder and phenolic resin dissolved in 1:1 ratio in furfuryl alcohol were mixed for about one hour. The filaments had a length of about 16 mm.

The cavity of an annular mould having an interior diameter of 150 mm, exterior diameter of 335 mm and height of 102 mm, was filled using the mixture thus obtained.

There followed the formation of the material and heating thereof at a temperature of about 100° C. to allow the polymerisation of the phenolic resin, obtaining a shaped body.

The body thus obtained was subjected to a first firing at the temperature of 1000° C. in inert atmosphere to allow the pyrolysis of the present carbon compounds and obtain a porous carbon structure.

After the pyrolysis, a mixture comprising fibres and/or carbon powder and SiC powder and phenolic resin dissolved in furfuryl alcohol was applied on the surface of the body so as to form a continuous and homogeneous surface layer.

The body provided with the aforementioned surface layer, interposed between two metal plates, was thus subjected to a heating up to 130° C., during which there occurred the polymerisation of the resin.

The body thus treated, after being removed from the mould, was thus arranged in a furnace, with inert atmosphere, in a bed of silicon granules. There followed the firing of the body at the temperature of 1000° C. over a period of time of 3 hours causing the pyrolysis of the polymerized surface layer.

Subsequently, there followed a second heating up to the temperature of 1800° C., thus causing the melting of the silicon granules at a pressure of 400 mbars unsuitable for infiltration and thus a vacuum step was carried out only afterwards at a pressure of 0.5 mbars proceeding to the infiltration of the molten silicon in the pyrolysed surface layer and in the underlying body. During this step there occurred the silication of the body with the reaction between Si and the free C to form a SiC matrix. The silicated surface layer allows preserving the underlying carbon fibres against oxidation.

The disc thus obtained, after cooling, is subjected to finishing by means of diamond tools to remove the deformations from the surface and reach the shape finale with the desired accuracy and tolerance for the successive machining operations.

According to an embodiment, it is provided for that the carbon fibres to be used for making the composite material be previously subjected to a pre-treatment comprising the following sub-steps. The carbon fibres, in form of filaments, filament bundles or fabrics are coated with a synthetic resin (for example furan or phenolic resins).

The fibres are thus compressed together into a mould for removing the present air and the resin is solidified maintaining the forming pressure.

The product thus obtained is then subjected to carbonisation in inert atmosphere up to maximum temperatures of 1250° C., preferably up to 850-950° C. Preferably the heating speed in the range between 300° C. and 600° C. should be slow, for example equivalent 4° C./h.

The carbonized product is thus impregnated under vacuum with an organic compound (for example phenolic resins, furan resins and/or pitches) and then once again subjected to carbonisation in this case at a greater speed. This second impregnation and carbonization has the aim of forming other carbon layers on the obtained product, closing possible pores present.

The product thus obtained is thus subjected to a graphitization process, at temperatures comprised between 1800° C. and 2400° C.

At this point the product is minced using a mincing machine, obtaining graphitized carbon fibre fragments.

The material thus obtained is then mixed with an organic binder (for example, phenolic and/or furan resins).

The obtained mixture is thus subjected to forming in a mould, with pressures comprised between 5 and 25 bars over a period of time varying from 30 mins to 5 hours, with the aim of far hardening the present resins.

The shaped body thus obtained is then subjected to carbonisation in inert atmosphere (pyrolysis) at temperatures comprised between 850° C. and 1250° C.

Advantageously there is provided for a graphitization process at temperatures comprised between 1800° C. and 2200° C.

The carbonized body is thus subjected to a silicon infiltration process of silicon at temperatures comprised between 1450° C. and 2200° C., preferably between 1650° C. and 1750° C. Upon reaching the temperature required for the infiltration of silicon into the porous body, but maintaining a pressure, for example of 300 mbars, unsuitable for infiltration, the pressure was lowered only subsequently for example at 0.1 mbars, starting a rapid infiltration and the formation of SiC, the treatment extends over a period of time comprised between 1 min and 3 mins.

According to a further embodiment, according to any one of the methods outlined above there are obtained parts of a component, for example a braking band, which are then assembled to each other to form a braking band, for example by bonding. This allows obtaining surface layers of the braking pads with different characteristics in proximity of the braking surfaces with respect to the braking band body, as well as confer a particular shape to the ventilation conduits or channels in case of a ventilated braking band.

EXAMPLE 5

Below is an example of preparation of the composite material according to the aforementioned embodiment of the process for producing a braking band composite structure of a brake disc according to the invention.

Carbon filament bundles 3K are mixed with an aqueous mixture (14% water) of phenolic resin for about one hour.

The mixture was subjected for 3 h to forming and hardening in the mould at the temperature of 140° C. and under a 5N/mm$^2$ pressure.

The shaped body thus obtained was then subjected to pyrolysis up to the final temperature of 900° C. over a period of 14 hrs.

At the end of the pyrolysis, the product was once again subjected to two impregnation and pyrolysis cycles for 8 h up to a maximum temperature of 950° C.

The product thus obtained was then subjected to a graphitization process for 20 min with heating in inert atmosphere up to 2200° C. The product thus treated was then minced up to obtaining a fraction equivalent to 48% of particles having dimensions between 0.25 mm and 2 mm and a fraction equivalent to 1% of particles of dimensions greater than 2 mm.

The minced material was then mixed for 15 mins with a phenolic resin added with micro-granules of carbon fossil tar pitch (grain-size ≤20 μm). The composition in percentage in weight was the following: 31.9% of phenolic resin, 9.6% of pitch and 58.5% of minced material.

The obtained mixture was thus subjected to forming in a mould, with a pressure of 10 bars and a temperature of 150° C. for 2 hrs, with the aim of hardening the present resin.

The shaped body thus obtained was then subjected to carbonization in inert atmosphere (pyrolysis) up to a maximum temperature of 900° C. over a period of time of 14 hrs, and subsequently to graphitisation for 15 mins in Argon atmosphere at a temperature of 2200° C.

The carbonized body is then subjected to a silicon infiltration process, first raising the temperature to 1750° C. and only subsequently liquefying silicon under vacuum at 3 mbars of absolute pressure.

The embodiments of the methods and plants described above, may be subjected—by a man skilled in the art with the aim of meeting contingent requirements—to modifications, adaptations and replacement of elements with other functionally equivalent elements, without departing from the scope of protection of the following claims. All characteristics described as belonging to a possible embodiment may be obtained independently from the other described embodiments.

REFERENCES 1 piece
2 second material
3 compound
4 crucible
5 cover
6 crucible chamber
7 gas suitable for separating second material
8 first material
9
10 carbon fibres
11 mould
12 binder—for example phenolic resin
13 forming furnace
14 pyrolysis furnace
28 plant
29 pressure reduction device
30 furnace
31 loading station
32 sealing station
33 cleaning station
34 vacuum creating device connection opening
35 heating station
36 inert gas injection station
37 final cooling station
38 furnace doors
39 station for removing the piece
40 heat supply step
41 exothermic phase
42 controlled cooling station
100 state of the art infiltration direction
101 disc
102 braking band
103 band body
104 braking surfaces
200 exothermicity direction
201 support bell
202 fastening means
300 control device
400 device for introducing inert gas into the plant
500 liquid
501 non-liquid for example grains
T temperature
p pressure
pa ambient pressure
p1 vacuum for cleaning crucible
pa1 pressure at which infiltration cannot occur
Ta ambient temperature
T2 infiltration temperature
p2 infiltration pressure
T3 first cooling temperature
DTi infiltration temperature range Dpi infiltration pressure range
X-X rotational axis and body symmetry
The invention claimed is:

1. A method for treating a piece made of a first porous material with a second material, when this second material is in liquid state, said second material being suitable for infiltration when it is in a predetermined temperature range (DTi) and a predetermined infiltration pressure range (Dpi), said method comprising the steps of:
   providing a crucible suitable for containing the piece and the second material and capable of withstanding the temperatures and pressures for the infiltration of the second material in the piece;
   providing a cover for the crucible creating a chamber inside the crucible;
   placing the piece and the second material in said crucible chamber, when the second material is not yet in liquid state;
   subsequently closing the crucible with the cover;
   at a pressure (pa or pa1) and a temperature range unsuitable for infiltrations of the second material in the first porous material, thus at a pressure unsuitable for infiltration even at the maximum temperature selected for the process (T2), raising the temperature of the piece and the second material contained in the crucible up to a predetermined temperature (T2) suitable for liquefying said second material for making it suitable for infiltration in said piece in the first porous material, avoiding the infiltration at said predetermined temperature (T2), and maintaining also at this temperature a pressure unsuitable for the infiltrations of the second material in the first porous material; and
   subsequently, after having obtained at least said predetermined temperature (T2), lowering the pressure to a predetermined pressure value (p2) lower than the previous pressure (pa or pa1) and allowing the infiltration of the second material in said piece made of first porous material.

2. The method according to claim 1, wherein said second material is selected so as to determine a reaction with said first material when infiltrated in said porous material, and/or wherein said second material is selected so as to be capable of reacting with the first material of the piece forming at least locally a compound when it is infiltrated in said first piece material.

3. The method according to claim 1, wherein there is provided the further step of:
   providing said cover for the crucible suitable for sealing the crucible and creating chamber inside the crucible in which it is possible to adjust the temperature (T) and the pressure (P) and/or wherein said cover for the crucible is suitable for extracting gas and creating vacuum in said crucible chamber.

4. The method according to claim 1, wherein said second material is added in the crucible chamber in the form of powder and/or granules and/or wherein said second material is silicon and/or wherein said first material is made of porous carbon matrix.

5. The method according to claim 1, wherein before the step of raising the temperature of the piece of the second material at the pressure unsuitable for infiltration of the second material in the piece, there is provided the steps of:
   preheating the piece and the second material, for example but not necessarily, at 1600° C. and a pressure not below 100-300 millibars, and/or
   supplying energy in order to further increase the temperature after reaching the predetermined temperature (T2) suitable for liquefying said second material for making it suitable for infiltration in said piece in the first porous material and after the beginning of the step of lowering the pressure to a predetermined pressure value (p2) lower than the previous pressure (pa or pa) and allowing the infiltration of the second material in said piece made of first porous material, and/or
   avoiding further supplying energy for increasing the temperature after reaching the predetermined temperature (T2) suitable for liquefying said second material for making it suitable for infiltration in said piece made of first porous material and after the beginning of the step of lowering the pressure to a predetermined pressure value (p2) lower than the previous pressure (pa or pa1) and allowing the infiltration of the second material in said piece made of first porous material.

6. The method according to claim 1, wherein before the step of lowering the pressure to determine the infiltration of the second material in the porous matrix of the first material, and before the step of raising the temperature at the pressure unsuitable for infiltration, there is provided the step of:
   lowering the pressure (p) of the chamber inside the crucible to a predetermined pressure value (pi) lower than the ambient pressure (pa) with the aim of evacuating from the crucible substances possibly present in the ambient area which could influence the method and/or wherein this step is provided at a temperature unsuitable for infiltration and/or at a pressure unsuitable for infiltration.

7. The method according to claim 1, wherein, before the step of raising the temperature at the pressure unsuitable for infiltration, there is provided the step of introducing gas into the chamber of the crucible, such as for example argon and/or nitrogen gas.

8. The method according to claim 1, wherein, after the step of raising the temperature at the pressure unsuitable for infiltration and without supplying energy for increasing the temperature (t2), but exploiting the exothermicity of the infiltration reaction, lowering the pressure to the predetermined pressure value (p2) lower than the previous pressure (pa or pa1) so as to allow the infiltration of the second material in said piece made of the first porous material, and/or wherein before the step of raising the temperature there is provided a step for the closure of the crucible with the cover which allows exploiting the exothermicity of the infiltration reaction of the second material in the first porous material, allowing a further temperature raise in the crucible chamber not induced from outside.

9. The method according to claim 1, wherein after the infiltration there is provided a step of controlled cooling in an argon and/or nitrogen gas environment and/or wherein said cooling step is provided with a cooling ramp moving from the maximum temperature reached during the method to 1000° C., preferably but not necessarily from 1800° C. to 1000° C., preferably but not necessarily from 1650° C. to 1000° C.

10. The method according to claim 1, wherein after the infiltration step there is provided a step of lowering the temperature to a predetermined temperature (T3) so that there occurs the solidification of the second material infiltrated in the first material and/or so that there occurs the solidification of the second material at least partly bound to the first material in a compound and/or wherein said lowering of temperature at least partly occurs by injecting in said crucible chamber an inert gas suitable for separating said second material from the piece when not infiltrated.

11. The method according to claim 1, wherein said infiltration step occurs through capillarity making the liquid of the second material placed at the crucible base raise through the piece and/or wicks, for example made of porous material similar to that of the piece.

12. The method according to claim 1, wherein said first material is made of porous carbon matrix obtained through carbon pyrolysis, for example but not necessarily obtained from the pyrolysis of a mixture comprising fibre and resin and/or wherein said resin before the pyrolysis and forming in a mould is in liquid state and/or wherein said resin before the pyrolysis and forming in a mould is in form of powder, and/or wherein there is provided for said first material obtained by forming carbon fibres added to powder resin with a heating at a temperature variable between 80° and 180° C., followed by the pyrolysis step at 900-1200° C.

13. The method according to claim 1, wherein before the step of heating at the pressure unsuitable for infiltration there is provided a step of preheating and lowering the pressure in the crucible chamber without infiltration occurring, and/or wherein before the step of heating at a pressure unsuitable for infiltration there is provided a step of lowering the pressure in the crucible chamber so as to remove impurities from the crucible chamber environment, and/or wherein the pressure is lowered to pressure suitable to facilitate the passage of the crucible to the furnace and a rapid, subsequent creation of vacuum suitable for infiltration and/or wherein between the different steps of the method there is provided for a low temperature gradient and/or a low pressure gradient and/or
wherein all the steps described in this claim is carried out in the same station and/or in the same furnace.

14. The method according to claim 1, wherein the first part of the process is developed with the temperature being raised in isobaric manner, at the pressure unsuitable for infiltration for the maximum temperature selected for the process and/or wherein, and in this step the pressure and temperature conditions to which the material is subjected always remain in a range of conditions unsuitable for infiltration, and/or wherein in the first step of the process there may be vacuum cycles for cleaning and degassing the material and/or wherein in a first step the temperature is raised and simultaneously the pressure is also increased so as to prevent the filtration from occurring, and/or wherein after reaching the predetermined temperature (T2) the pressure is decreased in a substantially isothermal manner to enter in a pressure and temperature range suitable for infiltration of the second material in the first and/or wherein after reaching the predetermined temperature (T2) the pressure is lowered and simultaneously the temperature is varied for example due to the exothermal reaction, the pressure is decreased and the temperature is simultaneously modified and/or wherein in the second step while the temperature is raised upon exceeding the predetermined temperature (T2) the pressure is lowered suddenly and/or wherein after reaching the predetermined temperature (T2) the pressure is reduced and the temperature is simultaneously increased or reduced to obtain particular effects such as for example reducing exothermal reactions.

* * * * *